United States Patent [19]

Tatsumi et al.

[11] Patent Number: 4,858,192
[45] Date of Patent: Aug. 15, 1989

[54] SEMICONDUCTOR MEMORY DEVICE WITH REDUNDANCY CIRCUIT

[75] Inventors: Yuuichi Tatsumi, Tokyo; Hidenobu Minagawa, Kawasaki; Hiroshi Iwahashi, Yokohama; Masamichi Asano, Tokyo; Mizuho Imai, Annaka, all of Japan

[73] Assignee: Kabushiki Kaisha Toshiba, Kawasaki, Japan

[21] Appl. No.: 225,510

[22] Filed: Jul. 28, 1988

[30] Foreign Application Priority Data

Jul. 29, 1987 [JP] Japan .................................. 62-189432

[51] Int. Cl.⁴ ................................................ G11C 7/00
[52] U.S. Cl. ...................................................... 365/200
[58] Field of Search ......................................... 365/200

[56] References Cited

U.S. PATENT DOCUMENTS

| | | | |
|---|---|---|---|
| 4,441,170 | 4/1984 | Folmsbee et al. | 365/200 |
| 4,635,232 | 1/1987 | Iwahashi et al. | 365/200 |
| 4,648,075 | 3/1987 | Segawa et al. | 365/200 |
| 4,750,158 | 6/1988 | Giebel et al. | 365/200 |
| 4,754,434 | 6/1988 | Wang et al. | 365/200 |

FOREIGN PATENT DOCUMENTS 62-52800  3/1987  Japan .

Primary Examiner—James W. Moffitt
Attorney, Agent, or Firm—Finnegan, Henderson, Farabow, Garrett & Dunner

[57] ABSTRACT

A semiconductor memory device has a redundancy circuit for compensating a defective bit when it occurs in the main memory cells. The redundancy circuit includes spare memory cells, a spare row decoder for selecting the spare memory cells, a first circuit section for inhibiting the use of the main row decoder when the spare row decoder is used, and a second circuit section for selecting the spare row decoder when an address specifying the main row line connected to the defective memory cell is denoted.

7 Claims, 3 Drawing Sheets

SEMICONDUCTOR MEMORY DEVICE WITH REDUNDANCY CIRCUIT

BACKGROUND OF THE INVENTION

1. Field of the Invention

This invention relates to a semiconductor memory device, and more particularly to a redundancy circuit for a defective memory cell.

2. Description of the Related Art

In an ordinary semiconductor memory device, a redundancy circuit is provided for saving the memory device even in a case where a defective cell is contained in at least one of main memory cells or regularly arranged memory cells. The redundancy circuit includes spare memory cells, spare row lines connected to the spare memory cells, a spare row decoder for selectively driving the spare row line to select the spare memory cells, and a control circuit for inhibiting the access operation with respect to the main memory cells and instead activating the spare row decoder when an address signal is generated to specify the row line to which the defective memory cell is connected.

In the semiconductor memory device having the redundancy circuit described above, if the row line to which the defective memory cell is connected is specified by an address signal, the spare memory cell is selected by an output of the spare decoder so as to use the spare memory cell instead of the defective memory cell. In this case, in order to inhibit the use of the row line to which the defective memory cell is connected, all the main row lines are set to logic "L" level when at least one of the spare row lines is selected.

In an erasable and programmable nonvolatile semiconductor memory device (EPROM), after data has been programmed into a selected memory cell, all the row lines are set to logic "L" level too. This operation is effected in order to perform a so-called verify mode operation for checking whether data has been correctly programmed or not by reading out data each time the data is programmed into the memory cell at each address. The verify mode is a kind of read mode. When the EPROM is in a read mode, a read voltage, for example, 5V, is applied to the selected row line, while when in a program mode, a program voltage, for example, 12.5V, is applied to the selected row line. In the verify mode, the programming address is used as a readout address, so that the high voltage of, 12.5V, applied to the row line in the programming mode is kept immediately after data has been programmed. If the verify mode is set immediately after the data programming, data cannot be correctly read out. Therefore the high voltage of selected row line is discharged after data has been programmed.

In the conventional EPROM having the redundancy circuit, the row lines will be discharged when the spare memory cell is used. And the main and spare row lines will be discharged by the reset signal after data has been programmed. A signal for selecting the spare row line and a reset signal for permitting the discharge operation are supplied to a logic gate, and the main row decoder is set into a nonoperable condition and the spare row line is selected in response to an output signal of the logic gate.

In the programming mode, if the address for the defective memory cell is specified the spare row line is selected so as to replace the defective memory cell by the spare memory cell. In this case, a circuit for selecting the spare row line and a circuit for setting the main row decoder into the nonoperable condition are operated in response to an output signal of the logic gate. When the reset signal for setting the verify mode is input, the output signal of the logic gate is set the same state as the spare row line is not selected. Therefore, when the reset operation is finished, the main row decoder is temporarily operated to activate the main row line connected to the defective memory cell, while the logic gate is in response to the spare row line selecting signal. As in the case of the verify mode operation, if data is read out immediately after the data is programmed into the memory cell, data programmed in the spare memory cell and that in the defective main memory cell will be read out at the same time, thus providing erroneous data at the beginning of the readout operation.

SUMMARY OF THE INVENTION

An object of this invention is to provide a semiconductor memory device in which a redundancy circuit can be correctly operated without causing a problem that erroneous data is read out by simultaneously selecting the spare row line and the main row line connected to the defective memory cell when the data is read out immediately after the data has been programmed.

According to one embodiment of this invention, there is provided a semiconductor memory device comprising an address buffer connected to receive an address signal; a main row decoder controlled in response to an output of the address buffer; main row lines selectively driven by an output of the main row decoder; main memory cells connected to the main row lines; at least one spare memory cell which is used instead of at least one of the main memory cells if it is defective; a spare row decoder for selecting the spare memory cell consists of a redundancy address setting circuit and buffer circuit; a de-activating circuit for setting the main row decoder into a nonoperable condition when the spare row decoder is selected; a determination circuit for determining whether or not the spare row decoder is used; the redundancy address setting circuit for determining whether or not the spare memory cell is used in response to an input address; a programming circuit for applying a high voltage to the main and spare row lines; a discharging circuit for discharging the main and spare row lines for a preset period of time irrespective of an output of the spare row decoder after the programming operation with respect to the main and spare memory cells is effected by the programming circuit; the de-activating circuit is controlled by the redundancy address setting circuit; and the buffer circuit is controlled by the redundancy address setting circuit and the discharging circuit.

In this invention, the circuit system for inhibiting the use of the main row decoder will not be affected by the reset signal for controlling the discharging operation when the verify mode operation is effected. Thus, a semiconductor memory device can be provided in which a redundancy circuit can be correctly operated without causing a problem that erroneous data is read out by simultaneously selecting the spare row line and the main row line connected to the defective memory cell when the data is read out immediately after the data has been programmed.

DETAILED DESCRIPTION OF THE PREFERRED EMBODIMENT

Figure 1:
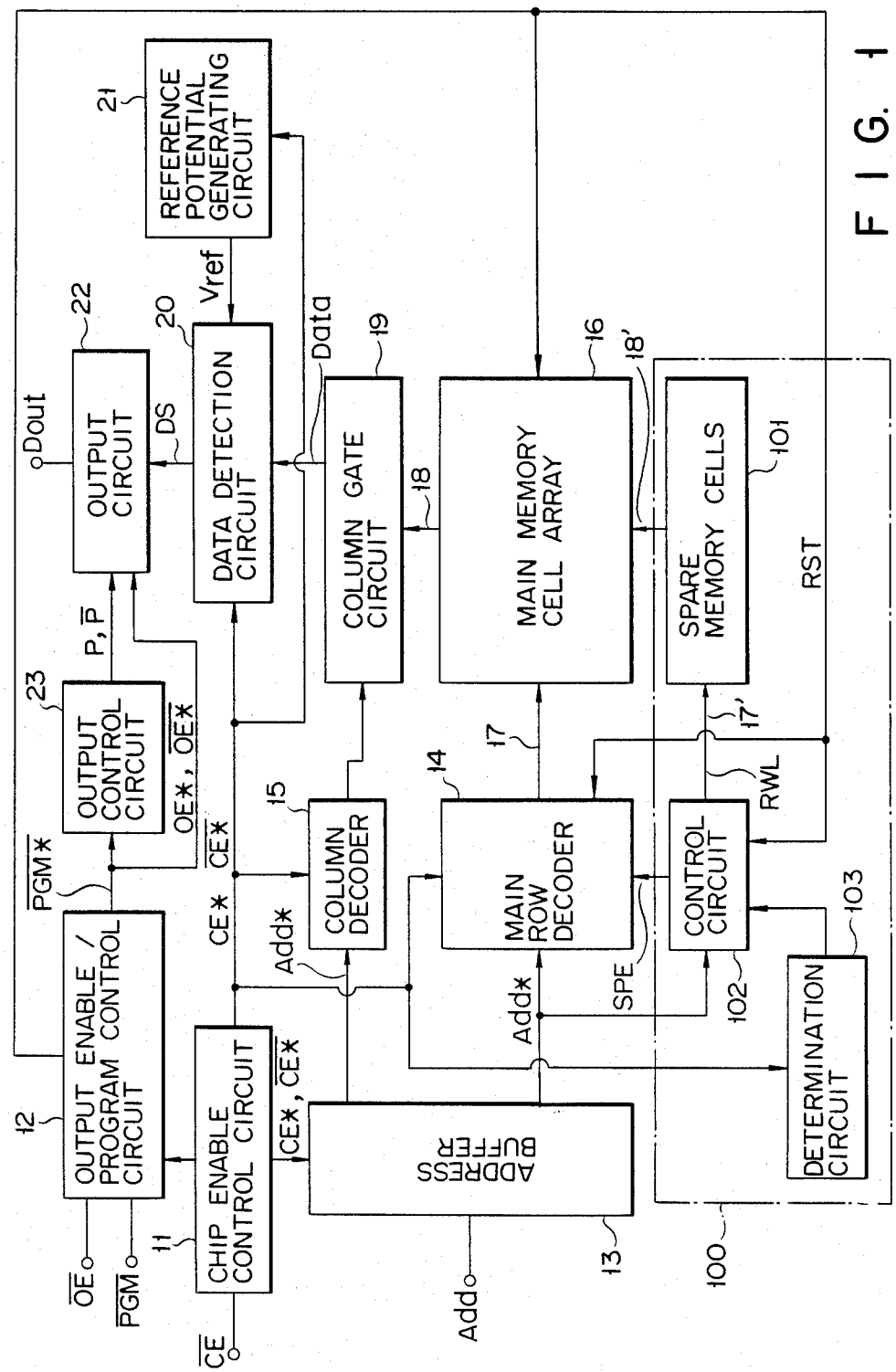
FIG. 1 is a block diagram showing the schematic construction of a semiconductor memory device according to one embodiment of this invention.

FIG. 1 shows the schematic construction of a semiconductor memory device (PROM) according to one embodiment of this invention. Chip enable control circuit 11 generates internal chip enable signals CE* and $\overline{CE^*}$ in response to chip enable signal $\overline{CE}$. Output enable/program control circuit 12 generates internal output enable signals OE* and $\overline{OE^*}$ and internal program signal $\overline{PGM^*}$ in response to externally supplied enable signal $\overline{OE}$ and program signal $\overline{PGM}$. External address signal Add and internal chip enable signals CE* and $\overline{CE^*}$ are input to address buffer 13 which is operated to output internal address signal Add* when signals CE* and $\overline{CE^*}$ are activated.

An internal address signal Add* output from address buffer 13 is supplied to main row decoder 14 and column decoder 15. Internal chip enable signals CE* and $\overline{CE^*}$ are also supplied to main row decoder 14 and column decoder 15. Main row decoder 14 is operated when chip enable signals CE* and $\overline{CE^*}$ are activated, and selectively drives main row line 17 in main memory cell array 16 in response to internal address Add*. Further, main row decoder 14 discharges main row line 17 and column line 18 in the verify mode operation in response to discharge controlling reset signal RST which is generated from output enable/program control circuit 12. In main memory cell array 16, data is read out from a plurality of memory cells (not shown) connected to main row line 17. Data thus read out is input to column gate circuit 19 via column line 18.

Column decoder 15 is operated when chip enable signals CE* and $\overline{CE^*}$ are activated, and controls the operation of column gate circuit 19 in response to internal address Add*. As a result of the control operation, column gate circuit 19 will select n bits out of m-bit data (m > n) read out from main memory cell array 16. Then, n-bit data selected by column gate circuit 19 is input to data detection circuit 20. Data detection circuit 20 is connected to receive signals CE* and $\overline{CE^*}$ are reference voltage Vref generated from reference voltage generating circuit 21. Data detection circuit 20 is operated when signals CE* and $\overline{CE^*}$ are activated, and determines data by comparing the data with reference voltage Vref. Data thus determined is input to output circuit 22.

Internal output enable signals OE* and $\overline{OE^*}$ and internal program signal $\overline{PGM^*}$ from output enable/program control circuit 12 and signals CE* and $\overline{CE^*}$ from chip enable control circuit 11 are supplied to output control circuit 23. Output control circuit 23 detects variation in level of external output enable signal $\overline{OE}$ based on internal output enable signals OE* and $\overline{OE^*}$, and produces pulses P and $\overline{P}$ with a preset pulse width. Pulse signals P and $\overline{P}$ are supplied together with internal output enable signals OE* and $\overline{OE^*}$ to output circuit 22. Output circuit 22 is operated in response to pulse signals P and $\overline{P}$ and internal output enable signals OE* and $\overline{OE^*}$ to supply data Dout of plural bits corresponding to detection data from data detection circuit 20 to the outside of the chip.

In this example, redundancy circuit 100 includes spare memory cells 101, control circuit 102 for controlling the operation of redundancy circuit 100, and determination circuit 103 for determining whether or not the spare row decoder is used. Spare memory cells 101 are arranged adjacent to main memory cell array 16. Control circuit 102 includes a spare row decoder for selecting spare memory cells 101, a circuit for generating signal SPE for setting main row decoder 14 into the nonoperable condition when the spare row line and spare row decoder are selected, a programming circuit for applying a programming voltage to the main and spare row lines, and a circuit for discharging the main and spare row lines for a preset period of time irrespective of an output of the spare row decoder after the programming operation has been completed. Determination circuit 103 is connected to receive signals CE* and $\overline{CE^*}$ from chip enable control circuit 11. An output signal of determination circuit 103, reset signal RST from output enable/program control circuit 12 and internal address signal Add from address buffer 13 are supplied to control circuit 102. Output signal SPE from control circuit 102 is used to control the operation of row decoder 14. Further, signal RWL supplied from control circuit 102 to spare row line 17' is used to select spare memory cell 101. When spare memory cell 101 is selected, row decoder 14 is set into the nonoperable condition in response to signal SPE. In this case, column lines 18' are commonly used for spare memory cells 101 and main memory cells.

Figure 2:
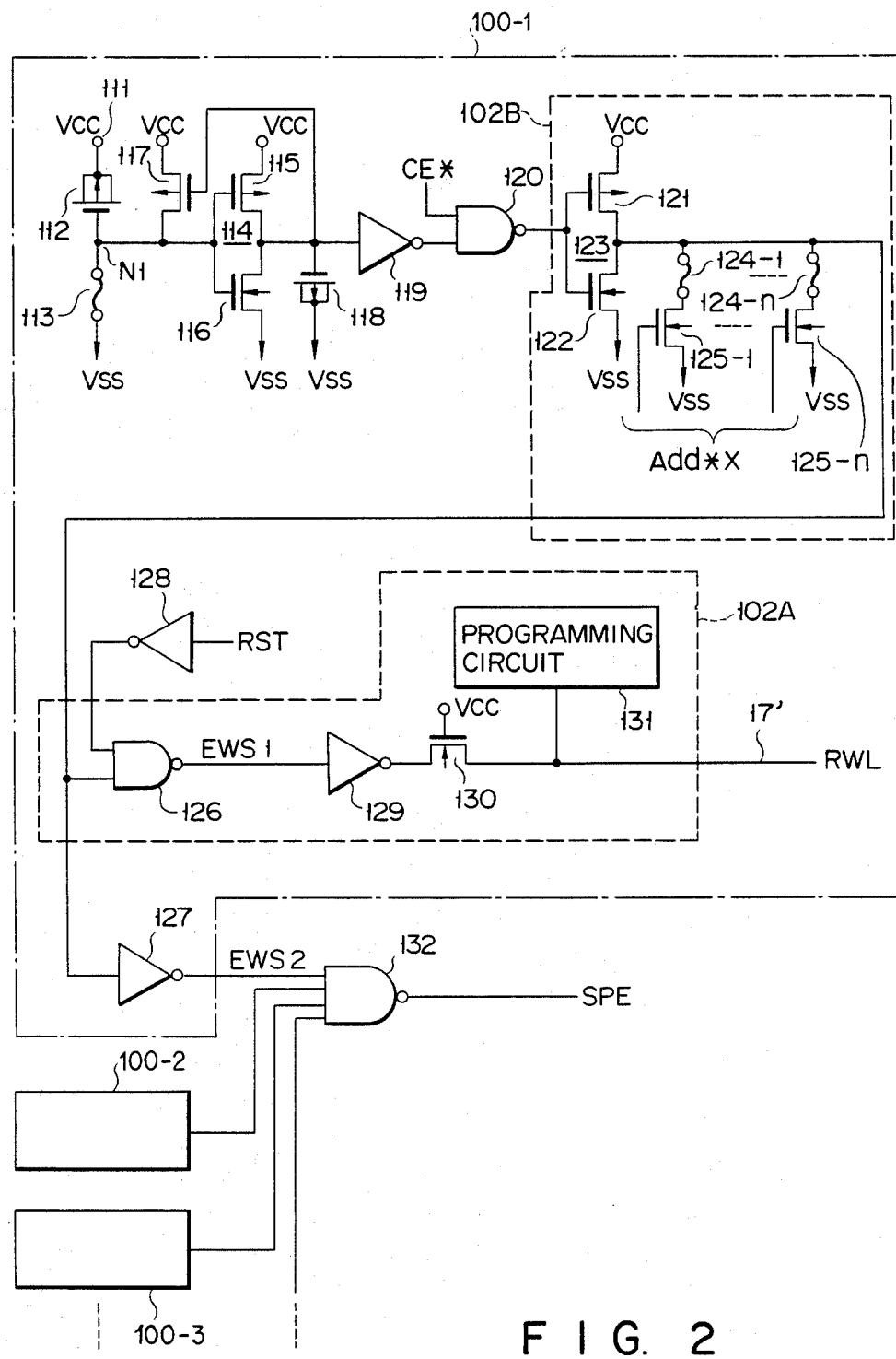
FIG. 2 is a circuit diagram showing the construction of a redundancy circuit section in the circuit of FIG. 1.

FIG. 2 shows the construction of redundancy circuit 100 in the circuit of FIG. 1. Power source terminal 111 to which power source voltage Vcc is applied is connected to source and drain of enhancement-type (E-type) P-channel MOS transistor 112. Fuse formed of, for example, polysilicon is connected between the gate of MOS transistor 112 and ground terminal Vss, and an input terminal of CMOS inverter 114 is connected to connection node N1 between the gate of MOS transistor 112 and fuse 113. CMOS inverter 114 is constituted by E-type P-channel MOS transistor 115 and E-type N-channel MOS transistor 116. The current path of E-type P-channel MOS transistor 117 is connected between connection node N1 and power source terminal Vcc. The gate of MOS transistor 117 is connected to an output terminal of CMOS inverter 114. Further, the output terminal of CMOS inverter 114 is connected to the gate of E-type P-channel MOS transistor 118. The source and drain of MOS transistor 118 are connected to ground terminal Vss. The output terminal of CMOS inverter 114 is also connected to an input terminal of inverter 119 whose output terminal is connected to one input terminal of NAND gate 120. The other input terminal of NAND gate 120 is connected to receive internal chip enable signal CE*. An output terminal of NAND gate 120 is connected to an input terminal of CMOS inverter 123 constituted by E-type P-channel MOS transistor 121 and E-type N-channel MOS transistor 122. An output terminal of CMOS inverter 123 is connected to one end of each of fuses 124-1 to 124-n formed of, for example, polysilicon. The current paths of E-type N-channel MOS transistors 125-1 to 125-n are respectively connected between the other ends of fuses 124-1 to 124-n and ground terminal Vss. Internal address signal Add*X specifying the row line connected to the defective memory cell is supplied to the gates of MOS transistors 125-1 to 125-n.

Further, the output terminal of CMOS inverter 123 is connected to one input terminal of NAND gate 126 and an input terminal of inverter 127. The other input terminal of NAND gate 126 is connected to an output terminal of inverter 128. An input terminal of inverter 128 is connected to receive discharge controlling reset signal RST which is supplied from output enable/program control circuit 12 to discharge spare row line RWL at the end of the programming operation. The output terminal of NAND gate 126 is connected to an input terminal of inverter 129 whose output terminal is connected to one end of the current path of E-type N-channel MOS transistor 130. The gate of MOS transistor 130 is connected to receive power source voltage Vcc, and the other end of the current path thereof is connected to spare row line 17' which in turn is connected to an output terminal of programming circuit 131. NAND gate 126, inverter 129, MOS transistor 130 and programming circuit 131 are combined to constitute buffer circuit 102A.

The output terminal of inverter 127 is connected to one input terminal of NAND gate 132, and the other input terminals of NAND gate 132 are connected to receive respective output signals of circuits 100-2, 100-3, . . . which are constituted with the same construction as circuit 100-1. Signal SPE for setting main row decoder 14 into the nonoperable condition is generated from output terminal of NAND gate 132 when the spare row decoder is operated.

The spare row decoder consists of the redundancy address setting circuit 102B and the buffer circuit 102A.

Figure 3:
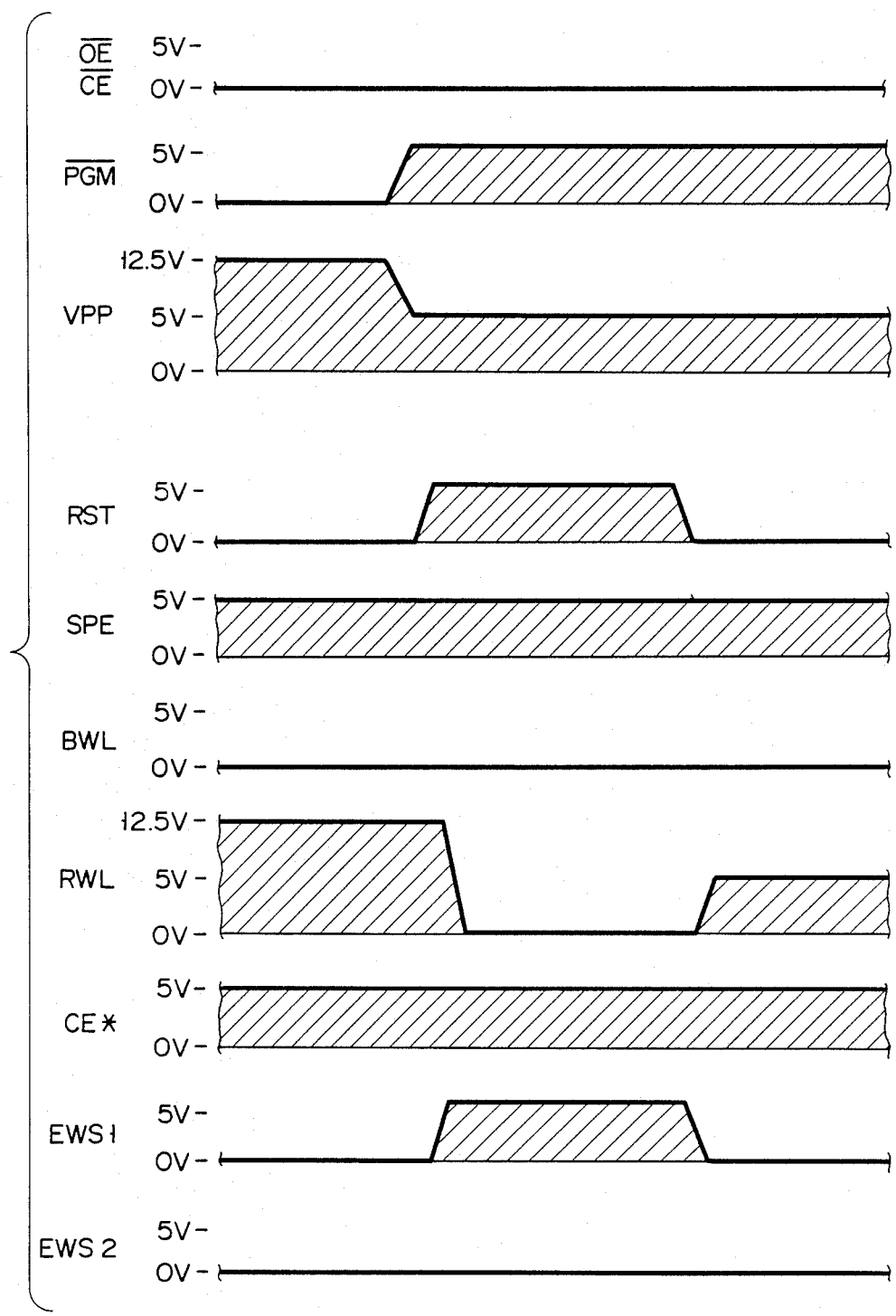
FIG. 3 is a waveform diagram of signals in the circuit of FIG. 2.

FIG. 3 shows the waveforms of signals indicated in FIGS. 1 and 2. Now, the operation of redundancy circuit 100 shown in FIG. 2 is explained with reference to FIG. 3.

Fuse 113 is not blown if there is no defective memory cell, and is blown if at least one defective memory cell is detected. If fuse 113 is blown, MOS transistor 112 functions as a capacitor for pulling up the potential at node N1 to a level higher than the circuit threshold voltage of CMOS inverter 114, when the power source voltage Vcc is increased after the power switch is turned on. Also, MOS transistor 118 functions as a capacitor for pulling down the potential at the output terminal of CMOS inverter 114 to a level lower than the circuit threshold voltage of inverter 119. If there is no defective memory cell or defective bit, an output of CMOS inverter 114 is set at "H" level and an output of inverter 119 is set at "L" level. Therefore, an output of NAND gate 120 is set at "H" level and an output of CMOS inverter 123 is set at "L" level irrespective of the level of chip enable signal CE*. As a result, output signal EWSI to NAND gate 126 is set at "H" level irrespective of the level of reset signal RST, and an output of inverter 129 is set at "L" level to set the spare memory cell into the nonoperative condition. In this case, output signal EWS2 of inverter 127 is set at "H" level and outputs of other circuits 100-2, 100-3, . . . so that output signal SPE of NAND gate 132 will be set to "L" level. As a result of this, main row decoder 14 is operated in a normal fashion.

In contrast, if there is at least one defective memory cell in main memory cell array 16, fuse 113 is blown. Further, fuses 124-1 to 124-n are selectively blown according to an address specifying the main row line connected to the defective memory cell. The node N1 is set at "H" level, and the output of inverter 114 is set to "L" level. Therefore, the output of inverter 119 is set to "H" level, and NAND gate 120 supplies an output signal of "L" or "H" level when chip enable signal CE* is at "H" or "L" level, respectively. In this way, the output signal of CMOS inverter 123 is set to "H" level in the chip enable condition. At this time, if the address specifying the row line connected to the defective memory cell is denoted, the potential at the output terminal of CMOS inverter 123 will not be lowered and an "H" level signal is supplied to one input terminal of NAND gate 126 and the input terminal of inverter 127. If, in this case, reset signal RST is set at "L" level, output signal EWS1 of NAND gate 126 is set to "L" level. As a result, the output signal of inverter 129 is set to "H" level, signal RWL which is supplied to spare row line 17 through MOS transistor 130 connected to the output terminal of inverter 129 is set to "H" level to select spare memory cell 101.

Since, in this case, output signal EWS2 of inverter 127 is set at "L" level, output signal SPE of NAND gate 132 is set to "H" level irrespective of the output levels of circuits 100-2, 100-3, . . . Thus, main row decoder 14 is set into the nonoperable condition.

Even when the input signal of inverter 123 is set at "L" level, the output node of inverter 123 may be discharged through at least one of fuses 124-j (j=1, . . . , n) which is not blown and a corresponding one of MOS transistors 125-j connected to the remaining fuse if the address specifying the main row line connected to the defective memory cell is not denoted. Therefore, an "L" level signal is supplied to one input terminal of NAND gate 126 and the input terminal of inverter 127, preventing the main memory cell from being replaced by the spare memory cell.

In the circuit shown in FIG. 2, the fuse 113, which is not blown in the absence of a defective bit, is blown in the presence of a defective bit so as to render the spare row decoder operable, as described above. In short, whether to use the redundancy circuit 100 is determined by the state of the fuse 113. However, where a defective bit is present, it is possible to perform replacement between the formal and spare row lines by simply blowing any one of the fuses 124-1 to 124-n designating the address in which the defective bit is present. In general, a signal in phase with the input address signal and an inverted signal thereof are supplied together as the internal address signal to the gates of the transistors 125-1 to 125-n. For example, where an internal address signal Add*i is supplied to the transistor 125-1, an internal address signal $\overline{\text{Add}}$*i is supplied to the transistor 125-2. The fuses 124-1 to 124-n are blown as follows in the presence of a defective bit. Where a defective address has been inputted, some of the internal address signals (Add*, $\overline{\text{Add}}$*) supplied to the gates of the transistors 125-1 to 125-n has "H" level. The fuse is blown which is connected to the drain of the transistor having the signal (Add*, $\overline{\text{Add}}$*) of "H" level supplied to the gate thereof. The blowing causes the fuse connected to the drain of the selected transistor (state of on) among the transistors 125-1 to 125-n to be blown. The other transistors connected to the fuses which have not been blown are rendered off because the potential supplied to the gates is of "L" level. It follows that discharge from the output terminal is not performed when the inverter 123 generates an output signal of "H" level, with the result that the potential at the output terminal of the inverter 123 is elevated to "H" level. The potential of "H" level is applied to the NAND gate 126 and to the inverter 127 so as to have the spare memory cell selected and the main row decoder non-selected.

The technique described above makes it possible to decrease the number of fuses which are blown by one (fuse 113). However, even where the redundancy circuit 100 is not used, the current flows from the power source Vcc to the ground Vss through the transistor 121, fuses 124-1 to 124-n and transistor 125-1 to 125-n when the memory device is active, leading to an increased power consumption of the device.

In a case where the verify mode operation is effected after data is programmed into the selected spare memory cell by applying a high voltage from programming circuit 131 to spare row line 17', reset signal RST is kept at "H" level for a preset period of time, thus setting output signal EWS1 of NAND gate 126 to "H" level. As a result, an output signal of inverter 129 is set to "L" level and spare row line 17' is discharged from the high potential. After reset signal RST is lowered to "L" level, data programmed in the spare memory cell is read out. When reset signal RST has varied, the input terminal of inverter 127 is kept at a high level potential. Therefore, output signal SPE of NAND gate 132 is also kept at "H" level and will not be influenced by the variation of reset signal RST. Thus, when the verify mode operation is effected while redundancy circuit 100 is used and even if data is read out immediately after the data programming, it is prevented that main row line 17 connected to the defective memory cell and spare row line 17' are selected at the sam time so as to permit the readout of erroneous data.

As described above, this invention has a feature that a circuit section (including inverter 127 and NAND gate 132 for generating signal SPE) for inhibiting the use of main row decoder 17 is isolated from a buffer circuit 102A for selecting spare row line 17.

With the construction described above, signal SPE for inhibiting the use of main row decoder 14 is not influenced by reset signal RST for discharging spare row line 17'. Therefore, when the verify mode operation is effected, the main row line connected to the defective memory cell will not be temporarily selected. Thus, signal SPE for inhibiting the use of row decoder 14 is inverted by reset signal RST so as to prevent the operation error in which the main row line connected to the defective memory cell and the spare row line are selected at the same time and erroneous data is read out.

What is claimed is:

1. A semiconductor memory device comprising:
   an address buffer connected to receive an address signal;
   a main row decoder controlled in response to an output of said address buffer;
   main row lines selectively driven by an output of said main row decoder;
   main memory cells connected to said main row lines;
   at least one spare memory cell which is used instead of at least one of said main memory cells if it is defective;
   a spare row decoder for selecting the spare memory cell includes redundancy address setting means for determining whether or not said spare memory cell is to be used in response to an input address, and a buffer circuit connected to the spare memory cell;
   de-activating means, for setting said main row decoder into a nonoperable condition when said spare memory cell is selected, is controlled by said redundancy address setting means;
   programming means for applying a high voltage to said main and spare row lines; and
   discharging means for discharging the main and spare row lines for a preset period of time after the programming operation with respect to said main or spare memory cells is effected by said programming means, said buffer circuit being controlled by said discharging means and said redundancy address setting means.

2. A semiconductor memory device according to claim 1, further comprising determination means for determining whether or not said spare row decoder is to be used.

3. A semiconductor memory device according to claim 2, wherein said determination means includes at least one fuse which is blown when a defective bit is detected in said main memory cells.

4. A semiconductor memory device according to claim 1 or 2, wherein said redundancy address setting means includes a plurality of fuses which are selectively blown according to an address specifying the main row line connected to the defective main memory cell.

5. A semiconductor memory device according to claim 1 or 2, wherein said programming means includes a programming circuit.

6. A semiconductor memory device according to claim 1 or 2, wherein said de-activating means includes a substantial NAND operation gate having input terminals corresponding said spare row lines, and an output of said NAND gate is supplied to said main row decoder.

7. A semiconductor memory device according to claim 1 or 2, wherein said main memory cells and spare memory cells are each formed of an erasable and programmable nonvolatile memory cell.

* * * * *